(12) United States Patent
Kang et al.

(10) Patent No.: US 7,561,467 B2
(45) Date of Patent: Jul. 14, 2009

(54) FLASH MEMORY DEVICE USING PROGRAM DATA CACHE AND PROGRAMMING METHOD THEREOF

(75) Inventors: Dong-Ku Kang, Seongnam-si (KR); Young-Ho Lim, Yongin-si (KR); Sang-Gu Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 351 days.

(21) Appl. No.: 11/657,697

(22) Filed: Jan. 25, 2007

(65) Prior Publication Data

US 2008/0056007 A1    Mar. 6, 2008

(30) Foreign Application Priority Data

Sep. 1, 2006   (KR) ............................... 2006-84270

(51) Int. Cl.
    *G11C 11/34* (2006.01)
(52) U.S. Cl. .............................. 365/185.12; 265/185.03
(58) Field of Classification Search ............ 365/185.22, 365/185.03, 185.17
    See application file for complete search history.

(56) References Cited

U.S. PATENT DOCUMENTS

| | | | | |
|---|---|---|---|---|
| 6,587,377 B2* | 7/2003 | Ichikawa | .................. | 365/185.2 |
| 6,937,510 B2 | 8/2005 | Hosono et al. | | |
| 7,016,226 B2 | 3/2006 | Shibata et al. | | |
| 7,440,331 B2* | 10/2008 | Hemink | .................. | 365/185.22 |
| 7,450,432 B2* | 11/2008 | Wang | .................... | 365/185.28 |
| 2006/0120159 A1 | 6/2006 | Sakuma et al. | | |
| 2007/0019468 A1* | 1/2007 | Seong et al. | ........... | 365/185.03 |

FOREIGN PATENT DOCUMENTS

| | | |
|---|---|---|
| JP | 5182474 | 7/1993 |
| JP | 2001-325796 | 11/2001 |
| JP | 2004-192789 | 7/2004 |
| JP | 2004326866 | 11/2004 |
| JP | 2005-025898 | 1/2005 |
| JP | 2006196153 | 7/2006 |
| KR | 1020010100809 A | 11/2001 |
| KR | 10-2004-0050697 A | 6/2004 |
| KR | 1020040048344 A | 6/2004 |
| KR | 1020050004142 A | 1/2005 |
| KR | 10-2006-0052627 A | 5/2006 |

* cited by examiner

*Primary Examiner*—Anh Phung
(74) *Attorney, Agent, or Firm*—Volentine & Whitt, PLLC

(57) ABSTRACT

A method is for programming a flash memory device which includes a plurality of memory cells storing multi-bit data representing one of a plurality of states. The method includes programming the multi-bit data into selected memory cells of the plurality of memory cells, the programming including a first verify-reading operation performed by a first verifying voltage, determining whether to execute a reprogramming operation for each of the selected memory cells, and reprogramming the selected memory cells in accordance with the determination. The reprogramming of the selected memory cells includes a second verify-reading operation performed by a second verifying voltage, the second verifying voltage being higher than the first verifying voltage.

23 Claims, 5 Drawing Sheets

FLASH MEMORY DEVICE USING PROGRAM DATA CACHE AND PROGRAMMING METHOD THEREOF

BACKGROUND

1. Field of the Invention

The present disclosure relates generally to flash memory devices and, more particularly, to a flash memory device with a program data cache and a method for programming the same.

A claim of priority under 35 U.S.C. § 119 is made to Korean Patent Application No. 2006-84270 filed on Sep. 1, 2006, the entire contents of which are hereby incorporated by reference.

2. Discussion of Related Art

There has been a surge in demand for both volatile and nonvolatile memories for use as memory storage components in a number of electronic devices. These electronic devices include a number of mobile devices such as, for example, MP3 players, personal multimedia players (PMP), mobile phones, notebook computers, personal digital assistants (PDA), and so on. Mobile devices typically require storage units with a large storage capacity but that are also small in size. One way to produce storage devices with a large storage capacity but small size is to manufacture a multi-bit memory device where each memory cell stores 2 bits or more of data.

Conventionally, in most memory devices, only 1-bit data is stored in a single memory cell. Specifically, in storing 1-bit data in a single memory cell, the memory cell is conditioned in a threshold voltage, corresponding to one of two threshold voltage states. Namely, the memory cell has one of two states that represent data '1' and data '0'. On the other hand, when a single memory cell stores 2-bit data, the memory cell is conditioned in a threshold voltage that corresponds to one of four threshold voltage states. In other words, the memory cell has one of four states representing data '11', data '10', data '00', and data '01'.

Because of an increase in the number of threshold voltage states, it may be beneficial to ensure that each voltage distribution is confined to a corresponding window such that there is no overlap between the voltage distributions. Furthermore, there should be sufficient margin between the voltage distributions to ensure that there are no programming errors.

In order to ensure that threshold voltage distribution profiles are confined within the corresponding windows associated with the four data states, it may be beneficial to adjust the threshold voltages within each window. One method of adjusting the threshold voltage within a corresponding window involves the use of a programming method using an ISPP (incremental step pulse programming) scheme. In the ISPP scheme, a threshold voltage increases in steps with an increase in the number of programming operations. Furthermore, it may be possible to control the distribution of threshold voltages by establishing the incremental rate of the program voltage to be small. This means that there is a sufficient margin between the threshold voltages of the various data states. However, a smaller incremental rate of program voltage lengthens a time required for programming a memory cell into a desired state. Therefore, the incremental rate of program voltage is established in consideration of programming time. Thus, for at least this reason, even with the ISPP scheme, distribution profiles of threshold voltages corresponding to the data states are typically wider than the desired width.

FIG. 1 is a schematic diagram showing a sequence in a programming scheme used for programming a general flash memory device. Referring to FIG. 1, a programming operation of the flash memory device is carried out in units of two adjacent word lines. Specifically, a page buffer 10 is electrically connected to bit lines corresponding to even and odd column addresses. In the programming operation, memory cells are programmed in the sequence of MC1->MC2->MC3->MC4 by the page buffer 10. In addition, a program voltage is applied to word lines WL_N-1 and WL_N.

In this case, a threshold voltage of the first programmed memory cell MC1 may be affected by programming carried out on its adjacent memory cells MC2, MC4, and MC4. In particular, a threshold voltage distribution profile of the memory cell MC1 may become wider because of coupling effects between the adjacent memory cells during the programming operation. Moreover, this phenomenon occurs at all the memory cells MC1~MC4 programmed by the page buffer 10. Such a coupling effect is referred to as 'F-poly coupling'. In a conventional programming method, the F-poly coupling effects are generated between all of adjacent memory cells being programmed.

FIG. 2 is a diagram illustrating program states of the memory cell MC1 affected from the aforementioned coupling effects between memory cells. Referring to FIG. 2, the memory cell MC1 is programmed into one of four data states '11', '01', '10', and '00'. A programming operation for writing 2-bit data in the memory cell MC1 may be carried out by various means. For example, the programming operation may begin after loading all LSB and MSB data bits into the page buffers 10 and 20. On the other hand, the programming operation may be carried out with first programming a LSB data bit and next programming an MSB data bit.

A memory cell is programmed into one of the data states '11', '01', '10', and '00'. Of the disclosed data states, the state '11' corresponds to an erased memory cell. Furthermore, a memory cell with the state '01' is at a higher threshold voltage level than a memory cell with the state '11'. In addition, a memory cell with the state '10' is at a higher threshold voltage level than a memory cell with the state '01' and a memory cell with the state '00' is at a higher threshold voltage level than a memory cell with the state '10'.

As illustrated in FIG. 2, after the programming operation carried out by the aforementioned method, the memory cell MC1 should preferably have a narrow distribution profile such as a state 31, 32, or 33. However, charges accumulate in a floating gate of the memory cell MC1 because of the F-poly coupling effect. This accumulation of charges in the memory cell MC1 because of the F-poly coupling effect may extend the voltage distribution profile of the memory cell MC1 to undesired states such as 34, 35, or 36, as shown in FIG. 2.

The extension of the threshold voltage distribution profile by the programming operations for adjacent memory cells may degrade the reliability of reading operations for the memory cell. This problem may be exacerbated as the number of data bits stored in a single memory cell increase. There is therefore a need for a programming method that programs a multi-bit memory cell without extending the voltage distribution profile of the memory cell beyond a desirable threshold.

The present disclosure is directed towards overcoming one or more limitations associated with the conventional programming of memory cells.

SUMMARY OF THE INVENTION

One aspect of the present disclosure includes a method for programming a flash memory device including a plurality of memory cells storing multi-bit data representing one of a plurality of states. The method comprises programming the multi-bit data into selected memory cells of the plurality of memory cells, the programming including a first verify-reading operation performed by a first verifying voltage, determining whether to execute a reprogramming operation for each of the selected memory cells, and reprogramming the selected memory cells in accordance with the determination, wherein the reprogramming the selected memory cells includes a second verify-reading operation performed by a second verifying voltage, the second verifying voltage being higher than the first verifying voltage.

Another aspect of the present disclosure includes a method for programming a flash memory device including a plurality of memory cells storing multi-bit data representing one of a plurality of states. The method comprises programming the multi-bit data into selected memory cells of the plurality of memory cells, the programming including a first verify-reading operation performed by a first verifying voltage, reading the selected memory cells with a second verifying voltage, the second verifying voltage being higher than the first verifying voltage, to obtain a read data, detecting under-programmed memory cells by comparing the read data with the multi-bit data, and reprogramming the under-programmed memory cells, wherein the reprogramming the under-programmed memory cells includes a verify-reading operation performed by the second verifying voltage.

Another aspect of the present disclosure includes a method for programming a flash memory device including a plurality of memory cells storing multi-bit data representing one of a plurality of states. The method includes programming the multi-bit data into selected memory cells of the plurality of memory cells, the programming including a first verify-reading operation performed by a first verifying voltage and reprogramming the multi-bit data into the selected memory cells, wherein reprogramming the selected memory cells includes a second verify-reading operation performed by a second verifying voltage, the second verifying voltage being higher than the first verifying voltage.

Yet another aspect of the present disclosure includes a flash memory device. The flash memory device includes a cell array including a plurality of memory cells storing multi-bit data representing one of a plurality of states, a voltage generator which provides a program voltage, a first verifying voltage, and a second verifying voltage to a word line of memory cells selected from the plurality of memory cells, a page buffer connected to bit lines of the plurality of memory cells, which writes the multi-bit data into the selected memory cells and conducts verify-reading and reading operations, a program cache which stores the multi-bit data in predetermined data units corresponding to the selected memory cells, and a program controller, which during a first programming operation, regulates the voltage generator to provide the first verifying voltage to the word line of the selected memory cells, and regulates the page buffer, the voltage generator, and the program cache to execute a second programming operation on a memory cell selected from the memory cells programmed by the first programming operation, based on the multi-bit data of the program cache.

Another aspect of the present disclosure includes a cell array including a plurality of memory cells storing multi-bit data representing one of a plurality of states, a voltage generator which provides a program voltage, a first verifying voltage, and a second verifying voltage to a word line of memory cells selected from the plurality of memory cells, a page buffer connected to bit lines of the plurality of memory cells, which writes the multi-bit data into the selected memory cells and conducts verify-reading and reading operations, a program cache which stores the multi-bit data in predetermined data units corresponding to the selected memory cells, and a program controller, which during a first programming operation, regulates the voltage generator to provide the first verifying voltage to the selected memory cells, and regulates the page buffer, the voltage generator, and the program cache to execute a second programming operation by loading the page buffer with the multi-bit data of the program cache subsequent to the first programming operation.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
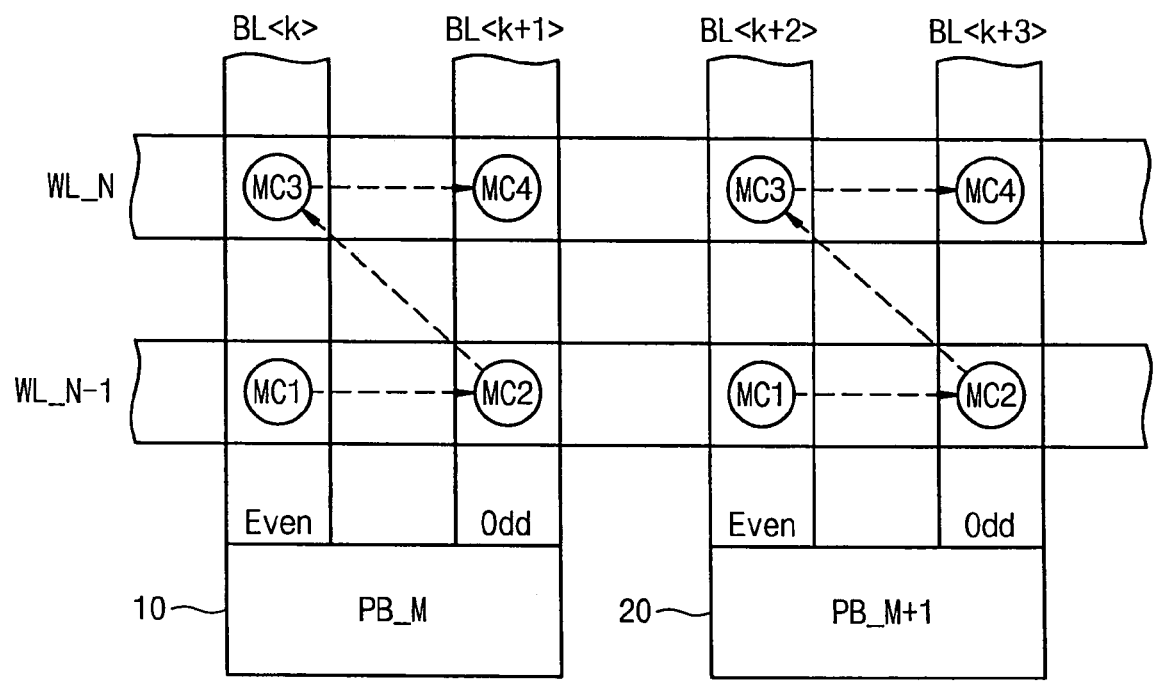
FIG. 1 is a schematic diagram showing a sequence of programming in a general flash memory device.
Figure 2:
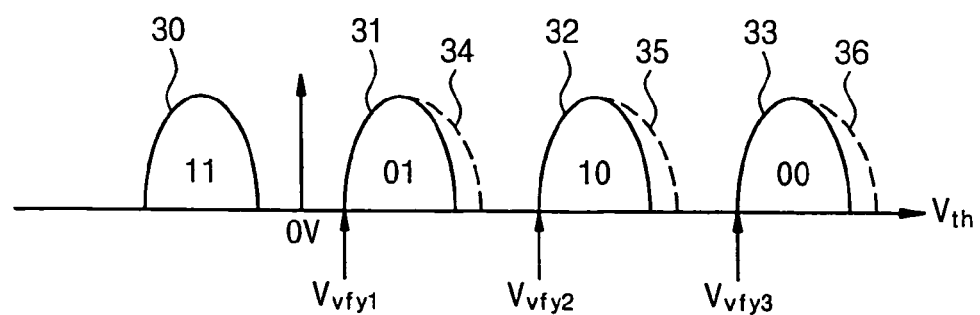
FIG. 2 is a diagram illustrating coupling effects between memory cells.

Exemplary embodiments of the present invention will be described below in more detail with reference to the accompanying drawings, showing a NAND flash memory device as an example for illustrating structural and operational features by the invention. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

In a programming operation according to an exemplary embodiment, 2-bit data is first programmed into a selected memory cell. Specifically, this programming is carried out by programming the memory cell with target threshold voltages corresponding to the desired data states. This is known as the 'first programming operation'. After completing the first programming operation, the memory cells are programmed with threshold voltages higher than the target threshold voltages corresponding to the desired data states, which is hereinafter referred to as 'second programming operation'.

Figure 3:
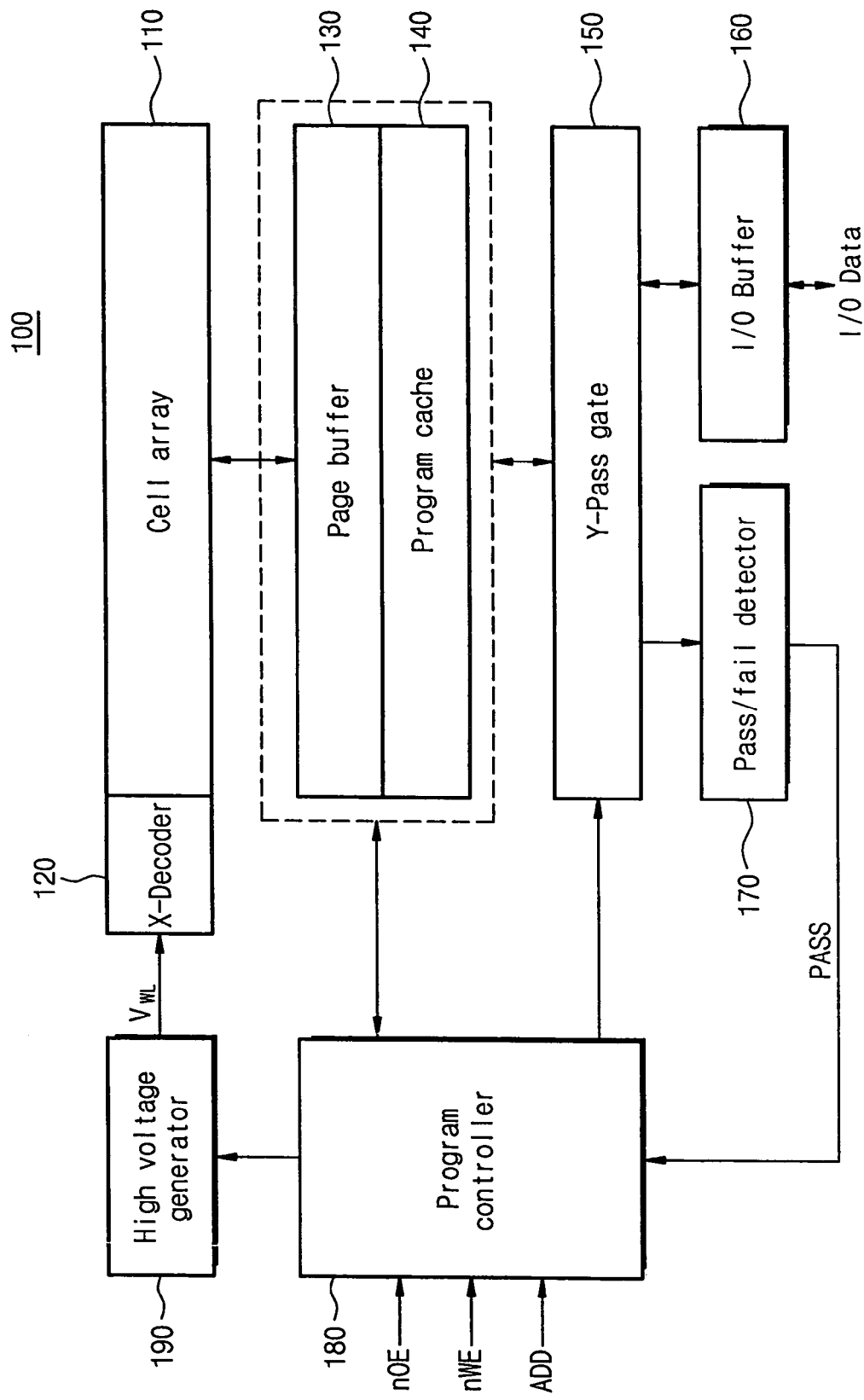
FIG. 3 is a block diagram illustrating a flash memory device according to an exemplary disclosed embodiment.

FIG. 3 is a block diagram illustrating a flash memory device 100 according to an exemplary disclosed embodiment. Referring to FIG. 3, the flash memory device 100 is comprised of a cell array 110 storing multi-bit data, an X-decoder 120, a page buffer 130, and a program cache 140. The device 100 also includes a Y-pass gate 150, an I/O buffer 160, a pass/fail detector 170, a program controller 180, and a high voltage generator 180. The program cache 140 temporarily stores multi-bit data to be loaded into the page buffer for programming. Furthermore, the load data stored in the program cache 140 is compared with read data in order to select which memory cells may need be reprogrammed. This aspect of the disclosure will be described in detail later.

The cell array 110 includes pluralities of memory cells arranged at intersections of word and bit lines. Specifically, in a NAND flash memory device, the cell array 110 is composed of memory blocks. Each memory block is treated as one unit for purposes of programming and erasing data. Furthermore, each memory block is divided into pages, each page including cells sharing a word line.

During a programming operation, program data loaded in the page buffer 130 is written into memory cells in one page. Generally, if the cell array 110 includes multi-level cells, the programming operation is carried out sequentially in units of two pages instead of one. By programming cells in two units, the voltage boosting efficiency may increase and the coupling effects between memory cells may decrease. That is, as shown in FIG. 1, the memory cells on two word lines in the page buffer 10 or 20 are programmed in the sequence of MC1->MC2->MC3->MC4.

Returning to FIG. 3, the row decoder 120 transfers a word line voltage from the high voltage generator 190 selectively to a word line of the cell array. This transfer of a word line voltage from the row decoder 120 to the cell array 110 occurs in response to a row address. Specifically, the row decoder 120 selects a block unit in response to a block address and then selects a page. Furthermore, during the programming operation, the row decoder 120 supplies a word line of the selected page with a program voltage Vpgm and a verifying voltage Vvfy that are provided from the high voltage generator 190.

The page buffer 130 is regulated by the program controller 180. Furthermore, the page buffer 130 includes a plurality of unit page buffers, each buffer associated with corresponding bit lines of the cell array 110. Furthermore, the page buffer 130 functions as a sense amplifier or write driver in accordance with an operation mode. In particular, each unit page buffer is electrically coupled with a single bit line or a number of bit lines forming a pair, and reads/stores data from/in the cell array through the bit line.

The multi-bit data is loaded in the program cache 140, which is regulated by the program controller 180. That is, current data to be programmed is loaded into the program cache 140. For example, during the programming operation for multi-bit data, 2-bit data per cell is loaded into the program cache 140. Furthermore, after completing the first programming operation for two pages by using data stored in the program cache 140, the program controller 180 may determine whether to conduct a reprogramming operation by comparing data of the program cache 140 with data read out from the page buffer 130. On the other hand, the program controller 180 may make a determination as to whether a reprogramming operation should be performed based only on the states of adjacent memory cells. That is, the program controller 180 may not perform a comparison between data programmed and data read. In this case, the program cache 140 is able to program data of the adjacent memory cells entirely or selectively.

The Y-pass gate 150 is regulated by the program controller 180. Furthermore, the Y-pass gate 150 transfers data from the page buffer 130 to an input/output (I/O) buffer 160 or a pass/fail detector 170. Specifically, the Y-pass gate 150 provides the page buffer 130 with program data supplied from the I/O buffer 160 for the programming operation. In addition, the Y-pass gate 150 supplies the pass/fail detector 170 with verifying data (e.g., '1') loaded in the page buffer 130 during a program-verifying (or verify-reading) step. Moreover, during a normal data reading operation, the Y-pass gate 150 provides the I/O buffer 160 with read data that is sensed from the cell array 110 and loaded into the page buffer 130.

The I/O buffer 160 temporarily stores program data output from an external system during the programming operation, and transfers the program data to the other components of the memory device 100. In addition, during the reading operation, the I/O buffer 160 transfers read data to an external system (e.g., a memory controller or host). The pass/fail detector 170 operates to check a pass state of programming by sensing data loaded in the page buffer 130 during the program-verifying step. Furthermore, the pass/fail detector 170 sends information about a pass state to the program controller 180.

In an exemplary disclosed embodiment, the program controller 180 conducts the first and second programming operations. Furthermore, the program controller 180 executes the program-verifying step for programmed cells with a first verifying voltage Vvfy_iniX (X is 1, 2, or 3) during a period of the first programming operation.

In addition, in an exemplary embodiment, the program controller 180 controls the high voltage generator 190 and the page buffer 130 to read data with a second verifying voltage Vvfy_finX (X is 1, 2, or 3). This second verifying voltage Vvfy_finX is provided to reprogram memory cells that have been programmed by the first programming operation. Specifically, after the first programming operation, the data read from the pager buffer 130 is compared with data stored in the program cache 140. If there is a mismatch between the read and the data of the program cache 140, a second programming operation is commenced.

In an alternative exemplary embodiment, the program controller 180, after completing the first programming operation, determines whether to conduct the second programming operation based on predetermined criteria with reference to adjacent cells' program data stored in the program cache 140. Here, the predetermined criteria may include conditions to determine whether to perform a second programming operation on adjacent cells that have been programmed by the first programming operation. Furthermore, the predetermined criteria may be set in the program controller 180 or provided from an external system. Based on the predetermined criteria, target cells to be reprogrammed are reprogrammed by the second programming operation along with verify-reading by the second verifying voltage Vvfy_finX. For this operation, the program controller 180 reads data from the program cache 140 and regulates the high voltage generator 190 and the page buffer 130.

In an alternative exemplary embodiment, the program controller 180, after completing the first programming operation, begins the second programming operation by moving program data from the program cache 140 to the page buffer 130. In this case, the second programming operation is carried out without reading the data programmed in the first programming operation and making any determination. Furthermore, the second programming operation is just carried out to reprogram the memory cells once with the program data stored in the program cache 140. To this end, the program controller 180 regulates the program cache 140 and the page buffer 130.

The high voltage generator 190 operates to generate voltages that are applied to word lines of the cell array 110 in response to regulation by the program controller 180. In particular, the high voltage generator 190 provides a selected word line with the first verifying voltage Vvfy_iniX that is lower than a normal verifying voltage in the first programming operation. Furthermore, the high voltage generator 190 also applies the second verifying voltage Vvfy_finX to a selected word line during the reading operation, in correspondence with each state of the threshold voltages. Specifically, the second verifying voltage Vvfy_finX is applied to execute the reprogramming operation (i.e., the second programming operation) on selected cells. Here, the second verifying voltages Vvfy_finX (i.e., Vvfy_fin1~Vvfy_fin3) arranged in correspondence with the states of threshold voltages are each higher than the first verifying voltages Vvfy_iniX (i.e., Vvfy_ini1~Vvfy_ini3). While the above-described voltages are applied to the word lines during the program-verifying steps included in the first and second programming operations, it should be noted that the program voltage Vpgm is applied to the selected word line prior to the verifying step.

The flash memory device shown in FIG. 3 includes the program cache 140 which stores data to be programmed (i.e., program data). Data stored in the program cache 140 is programmed into the cell array by the first verifying voltage Vvfy_iniX. Typically, this first verifying voltage Vvfy_iniX is lower than a normal verifying voltage used during the first programming operation. Furthermore, in the reading operation to determine execution of the second programming (or reprogramming) operation for programmed memory cells, the second verifying voltage Vvfy_finX, which is higher than the first verifying voltage Vvfy_iniX, is used therefor instead of a normal read voltage. In addition, data read by the second verifying voltage Vvfy_finX is compared with data stored in the program cache 140. Moreover, based on this comparison, memory cells whose data bits do not match with those stored in the program cache 140, are selected for reprogramming. In particular, the selected memory cells are reprogrammed through the second programming operation. Furthermore, in the second programming operation, the selected memory cells are conditioned in dense distribution profiles within their threshold voltages.

Figure 4:
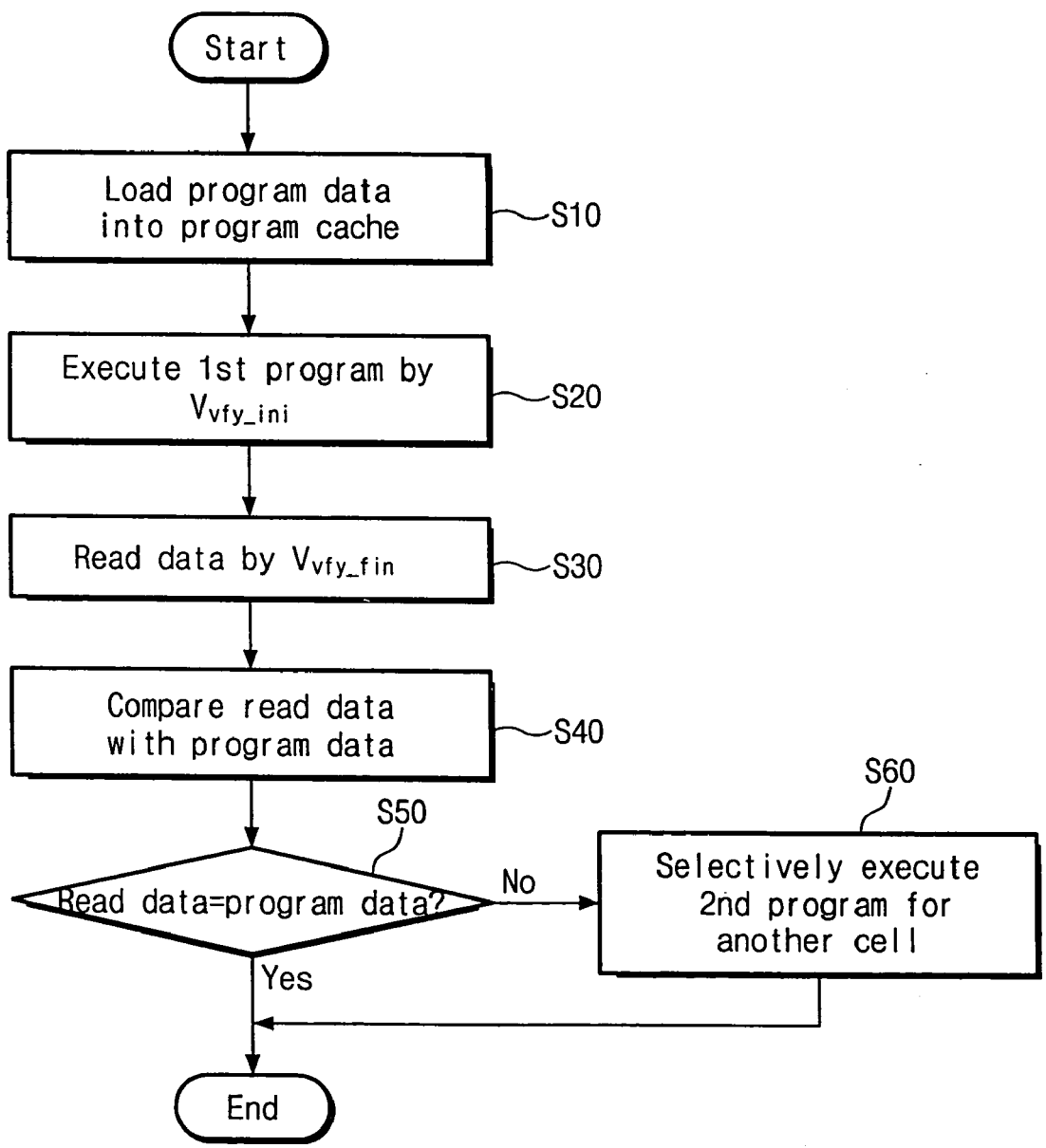
FIG. 4 is a flow chart illustrating steps in programming a flash memory device according to an exemplary disclosed embodiment.

FIG. 4 is a flow chart showing an operation of the program controller 180, in an exemplary embodiment. Referring to FIG. 4, in general, the first verifying voltage Vvfy_iniX is used for the first programming operation. Then, the programmed data is read out from the memory cells by the second verifying voltages Vvfy_finX and compared with data stored in the program cache 140. After this comparison, the second programming operation is carried out and then the entire programming operation is terminated. Hereinafter, a more detailed explanation of the above-disclosed embodiment will be provided.

At step 10, the program controller 180 loads program data into the program cache 140 (S10). Specifically, the program controller 180 sequentially loads the page buffer 130 with data identical to the data loaded in the program cache 140 and programs the memory cells in the sequence of MC1->MC2->MC3->MC4. Furthermore, at step 20, in each loop of the first programming operation, the program-verifying step is carried out with the first verifying voltage Vvfy_iniX. Furthermore, the first verifying voltages Vvfy_iniX are lower than the target levels corresponding to each of the states of threshold voltages (S20). After completing the first programming operation, at step 30, a reading operation is carried out for detecting the threshold voltage states of memory cells that have passed through the first programming operation. In particular, this reading operation is to determine whether to execute the second programming operation. Thus, this reading operation is different than a normal reading operation. Thus, a voltage applied to a selected word line during this reading operation is used with the second verifying voltage Vvfy_finX (S30).

After the reading operation, at step 40, the data read is compared with data loaded in the program cache 140. In an exemplary embodiment, this comparison may be carried out by means of an additional comparator. Alternatively, a plurality of switches may be provided to connect latches of the program cache 140 and the page buffer 130 with each other in correspondence with their data bits. Furthermore, the plurality of switches may be regulated by the program controller 180 and turned off at the end of the reading operation (S40). Then, at step 50, based on the comparison, if the data of the program cache 140 is identical to the read data, the programming is terminated. However, if the data of the program cache 140 does not match, then at step 60, the second programming step is performed (S60). Specifically, in the second programming operation, memory cells whose data does not match with that stored in the program cache 140 are programmed again.

Thus, in an exemplary embodiment illustrated by FIG. 4, the first programming operation with the first verifying voltage Vvfy_iniX is carried out to shift the threshold voltage distributions toward relatively lower sides. Furthermore, the reading operation by the second verifying voltage Vvfy_finX is carried out to detect memory cells having threshold voltages positioned between the first and second verifying voltages Vvfy_iniX and Vvfy_finX. Thereafter, the second programming operation is carried out to reduce the lower portions of the threshold voltage distributions corresponding to the detected memory cells.

Figure 5:
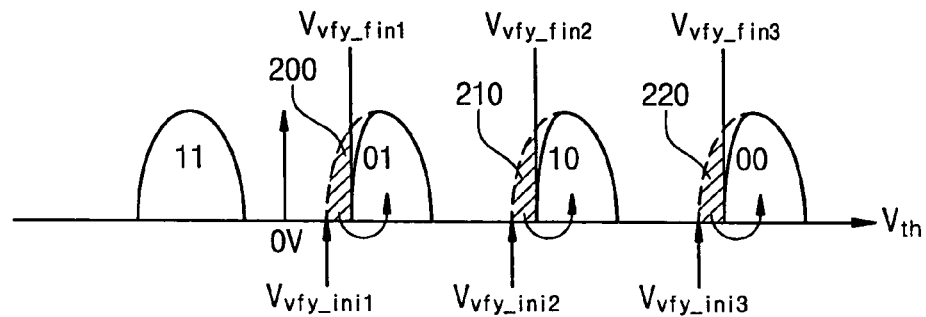
FIG. 5 is a diagram illustrating distribution profiles of threshold voltages in accordance with the programming method shown in FIG. 4.

FIG. 5 is a diagram illustrating effects of improving distribution profiles of threshold voltages by the programming method shown in shown in FIG. 4. Referring to FIG. 5, the memory cells programmed in each of the data states may be conditioned with threshold voltages that are settled between the first and second verifying voltages Vvfy_iniX and Vvfy_finX after the first programming operation. However, their threshold voltages can be improved to be over the second verifying voltages Vvfy_finX by the second programming operation. This feature of an exemplary embodiment discussed above will now be described in detail with respect of a memory cell that is programmed with data '10'.

After the first programming operation, threshold voltages of some of the memory cells may be partially distributed around the lower side 210. However, the threshold voltages of most cells are distributed around the average value. Therefore, when the program-verifying step is carried out by the first verifying voltage Vvfy_ini2 in the first programming operation, there are some memory cells distributed around the lower side 210. These cells cannot be detected as having the state '10' through the reading operation by the second verifying voltage Vvfy_fin2. There is therefore a mismatch between the data read from these cells and the data stored for these cells in the program cache 210. These memory cells, whose data read by the second verifying voltage Vvfy_fin2 mismatches with data of the program cache 140, are selected for a second programming operation. The second programming operation improves the distribution profiles of the threshold voltages of these cells. Thus, after the second programming operation, the threshold voltage distribution of these memory cells moves toward the upper side of the second verifying voltage Vvfy_fin2. While the aforementioned feature is described with respect to memory cells programmed with data '10', this feature is also applicable to other data states '01' and '00' with the same effect.

Figure 6:
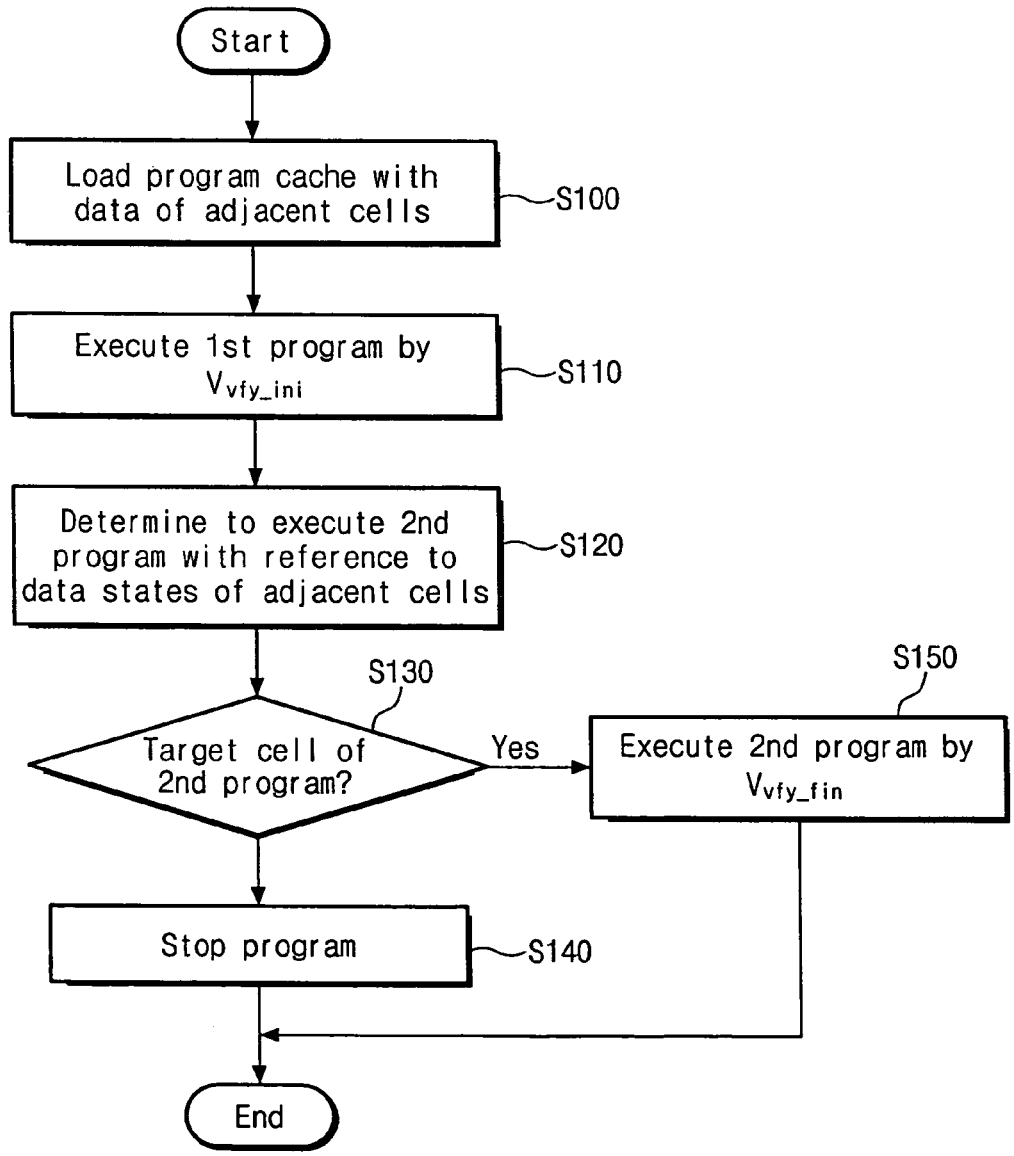
FIG. 6 is a flow chart illustrating steps in programming a flash memory device according to an alternative exemplary disclosed embodiment.

FIG. 6 is a flow chart showing an alternative exemplary embodiment in programming a flash memory device. Referring to FIG. 6, there is no reading operation for detecting a result of the first programming operation. Instead of that, program data of memory cells adjacent to a memory cell to be programmed are loaded into the program cache 140. Then, based on the data loaded into the program cache 140, a determination is made as to whether or not to perform a second programming operation for the memory cell. This feature will now be described in detail in conjunction with FIG. 3.

In the beginning of the programming, at step 100, data of the cells adjacent to memory cells to be programmed is loaded into the program cache 140. For example, in the case of programming the memory cells MC1~MC4, data to be programmed in the memory cells MC1~MC4 may be loaded into the program cache 140 (S100). After loading the program data into the program cache 140, the program controller 180 executes the first programming operation at step 110. During the first programming operation, the verify-reading voltage used to detect each data state is the first verifying voltage Vvfy_iniX (S110). After completing the first programming operation, at step 120, the program controller 180 determines whether to conduct the second programming operation for the programmed cells. This determination is made in accordance with predetermined criteria with reference to the data of the adjacent memory cells. The predetermined criteria may set based on many factors. In an exemplary embodiment, the predetermined criteria are set based on the coupling effects on the memory cell MC1. For example, the coupling effects on the memory cell MC1 may increase when program data of the adjacent cells correspond to states of high threshold voltages (e.g., data '00'). Thus, if the adjacent memory cells will be programmed with data corresponding to high threshold voltages, the second programming operation will not be carried out to the memory cell MC1.

On the other hand, if program data of the adjacent cells correspond to low threshold voltages or data states (e.g., data '11' or '01'), the memory cell MC1 is relatively less affected by the coupling effects. In this case, a threshold voltage of the memory cell MC1 is set between the first and second verifying voltages Vvfy_iniX and Vvfy_finX. In an exemplary embodiment, the program controller 180 makes a determination to execute the second programming operation by detecting data of the adjacent cells from the program cache 140. The following Table 1 summarizes the predetermined criteria for determining execution of the second programming operation.

TABLE 1

| Data of MC2 | Data of MC3 | Execution of 2nd program |
|---|---|---|
| 11 | 11 | Y |
| 11 | 01 | Y |
| 11 | 10 | N |
| 11 | 00 | N |
| 01 | 11 | Y |
| 10 | 11 | N |
| 00 | 11 | N |

Table 1 shows exemplary patterns of criteria for determining execution of the second programming operation for the memory cell MC1. Furthermore, it is also permissible to consider data of the memory cell MC4 as the adjacent cell, instead of the memory cells MC2 and MC3, in determining whether to execute the second programming operation for the memory cell MC1 (S120). Once a determination is made as to whether a second programming operation may be carried out, then at step 130, a comparison is carried out to detect whether the memory cell MC1 is required to be put into the second programming operation (S130). If the adjacent cells are conditioned to make the second programming operation unnecessary, the second programming operation does not begin and the programming is terminated at step 140 (S140). On the other hand, if there is a need to execute the second programming operation, then the second programming operation is carried out at step 150 (S150).

Figure 7:
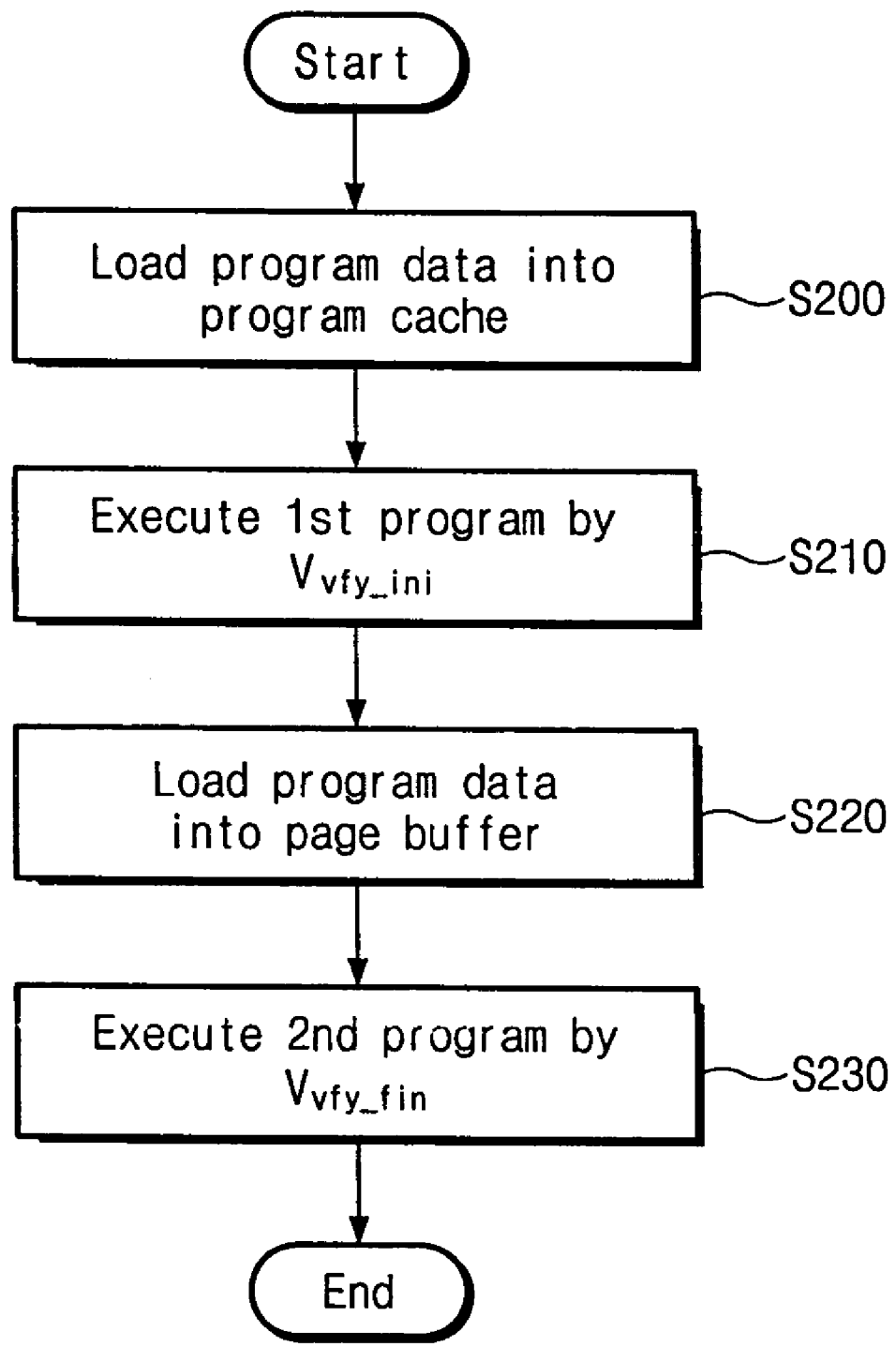
FIG. 7 is a flow chart illustrating steps in programming a flash memory device according to another alternative exemplary disclosed embodiment.

FIG. 7 is a flow chart illustrating another exemplary embodiment for a flash memory device. Referring to FIG. 7, in an exemplary embodiment, there is no performance of a reading operation with the second verifying voltage Vvfy_finX after the first programming operation. Furthermore, no reference is made to the data associated with the adjacent cells in determining whether to execute a second programming operation on a memory cell. These features of an exemplary embodiment will now be described in detail with reference to FIG. 7.

At the beginning, at step S200, the program controller 180 loads program data into the program cache 140 (S200). After loading the program data into the program cache 140, the program controller 180 loads the page buffer with data stored in the program cache 140, and conducts the first programming operation at step 210. Specifically, the first programming operation carried out includes a program-verifying step using the first verifying voltage Vvfy_iniX (S210). After the first programming operation, at step 220, the program controller 180 reloads the page buffer 130 with the data of the program cache 140 (S220). The program controller 180 then uses this data of the program cache 140 to execute the second programming operation for all the memory cells at step 230.

During the second programming operation, there may be memory cells whose threshold voltage is already over the second verifying voltage Vvfy_finX. These cells may be inhibited from being reprogrammed by the program-verifying (or verify-reading) step in the first loop of the second programming operation. Therefore, the threshold voltage distribution profiles of memory cells whose threshold voltage is higher than the second verifying voltage Vvfy_iniX do not change despite the second programming operation.

On the other hand, other memory cells whose threshold voltage is between the first and second verifying voltages Vvfy_iniX and Vvfy_finX, are reprogrammed such that their threshold voltage increases towards the second verifying voltage Vvfy_finX, through the second programming operation. As a result, the overall distribution profiles of threshold voltages for the memory cells may result in denser patterns. After completing the second programming operation, the programming procedure ends at step 140 (S140).

The above described memory programming system and method may be used to program any memory device. By mitigating unwanted effects such as, for example, F-poly coupling effects, the disclosed programming method may ensure a dense voltage distribution profile of programmed memory cells. Specifically, by detecting memory cells having a voltage distribution at the lower side of the target threshold voltage level and programming such cells in a second programming operation, the disclosed programming method may ensure the proper voltage distribution profile for all programmed memory cells.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for programming a flash memory device which includes a plurality of memory cells storing multi-bit data representing one of a plurality of states, the method comprising:
    programming the multi-bit data into selected memory cells of the plurality of memory cells, the programming including a first verify-reading operation performed by a first verifying voltage;
    determining whether to execute a reprogramming operation for each of the selected memory cells; and
    reprogramming the selected memory cells in accordance with the determination,
    wherein the reprogramming the selected memory cells includes a second verify-reading operation performed by a second verifying voltage, the second verifying voltage being higher than the first verifying voltage.

2. The method as set forth in claim 1, further comprising loading a program cache with the multi-bit data corresponding to each of the selected memory cells.

3. The method as set forth in claim 1, wherein the selected memory cells are adjacent to each other and programmed in sequence.

4. The method as set forth in claim 3, wherein determining whether to execute the reprogramming operation for a selected memory cell includes determining whether memory cells to be programmed later will cause a coupling effect on the selected memory cell, based on the multi-bit data of the later programmed memory cells.

5. The method as set forth in claim 4, wherein when at least one of the multi-bit data of the later programmed memory cells corresponds to a state over a predetermined threshold voltage; the selected memory cell is excluded from the reprogramming operation.

6. The method as set forth in claim 5, wherein when states corresponding with the multi-bit data of the later programmed memory cells are lower than the predetermined threshold voltage, the selected memory cell is determined to be reprogrammed.

7. The method as set forth in claim 6, wherein the first and second verifying voltages correspond to programmed states among the plurality of states.

8. A method for programming a flash memory device which includes plurality of memory cells storing multi-bit data representing one of a plurality of states, the method comprising:
    programming the multi-bit data into selected memory cells of the plurality of memory cells, the programming including a first verify-reading operation performed by a first verifying voltage;
    reading the selected memory cells with a second verifying voltage, the second verifying voltage being higher than the first verifying voltage, to obtain a read data;
    detecting under-programmed memory cells by comparing the read data with the multi-bit data; and
    reprogramming the under-programmed memory cells,
    wherein the reprogramming the under-programmed memory cells includes a verify-reading operation performed by the second verifying voltage.

9. The method as set forth in claim 8, further comprising loading a program cache with the multi-bit data corresponding to each of the selected memory cells.

10. The method as set forth in claim 8, wherein the selected memory cells are adjacent to each other and programmed in sequence.

11. The method as set forth in claim 8, wherein the first and second verifying voltages correspond to programmed states among the plurality of states.

12. A method for programming a flash memory device which includes plurality of memory cells storing multi-bit data representing one of a plurality of states, the method comprising:
    programming the multi-bit data into selected memory cells of the plurality of memory cells, the programming including a first verify-reading operation performed by a first verifying voltage; and
    reprogramming the multi-bit data into the selected memory cells,
    wherein reprogramming the selected memory cells includes a second verify-reading operation performed by a second verifying voltage, the second verifying voltage being higher than the first verifying voltage.

13. The method as set forth in claim 12, further comprising loading a program cache with the multi-bit data corresponding to each of the selected memory cells.

14. The method as set forth in claim 12, wherein the selected memory cells are adjacent to each other and programmed in sequence.

15. A flash memory device comprising:
    a cell array including a plurality of memory cells storing multi-bit data representing one of a plurality of states;
    a voltage generator which provides a program voltage, a first verifying voltage, and a second verifying voltage to a word line of memory cells selected from the plurality of memory cells;
    a page buffer connected to bit lines of the plurality of memory cells, which writes the multi-bit data into the selected memory cells and conducts verify-reading and reading operations;
    a program cache which stores the multi-bit data in predetermined data units corresponding to the selected memory cells; and
    a program controller, which during a first programming operation, regulates the voltage generator to provide the first verifying voltage to the word line of the selected memory cells, and regulates the page buffer, the voltage generator, and the program cache to execute a second programming operation on a memory cell selected from the memory cells programmed by the first programming operation, based on the multi-bit data of the program cache.

16. The flash memory device as set forth in claim 15, wherein the second programming operation includes a verify-reading operation performed by the second verifying voltage, the second verifying voltage being higher than the first verifying voltage.

17. The flash memory device as set forth in claim 15, wherein the program controller selects target memory cells for the second programming operation in accordance with states of adjacent memory cells and with reference to the multi-bit data stored in the program cache.

18. The flash memory device as set forth in claim 17, wherein the program controller determines whether to execute the second programming operation for a previously programmed memory cell by determining whether memory cells to be programmed later will cause a coupling effect on the previously programmed memory cell, based on the multi-bit data of the later programmed memory cells.

19. The flash memory device as set forth in claim 18, wherein the program controller includes the previously programmed memory cell in the second programming operation when threshold voltage states corresponding with the multi-bit data of the later programmed memory cells are conditioned in erased states.

20. The flash memory device as set forth in claim 15, wherein the program controller reads data from the selected memory cells after the first programming operation, with the second verifying voltage that is higher than the first verifying voltage.

21. The flash memory device as set forth in claim 20, wherein the program controller selects target memory cells for the second programming operation by comparing the read data with the multi-bit data stored in the program cache.

22. A flash memory device comprising:
- a cell array including a plurality of memory cells storing multi-bit data representing one of a plurality of states;
- a voltage generator which provides a program voltage, a first verifying voltage, and a second verifying voltage to a word line of memory cells selected from the plurality of memory cells;
- a page buffer connected to bit lines of the plurality of memory cells, which writes the multi-bit data into the selected memory cells and conducts verify-reading and reading operations;
- a program cache which stores the multi-bit data in predetermined data units corresponding to the selected memory cells; and
- a program controller, which during a first programming operation, regulates the voltage generator to provide the first verifying voltage to the selected memory cells, and regulates the page buffer, the voltage generator, and the program cache to execute
- a second programming operation by loading the page buffer with the multi-bit data of the program cache subsequent to the first programming operation.

23. The flash memory device as set forth in claim 22, wherein the second programming operation includes a verify-reading operation performed by the second verifying voltage that is higher than the first verifying voltage.

* * * * *